United States Patent
Thompson (10) Patent No.: US 7,391,839 B2
(45) Date of Patent: Jun. 24, 2008

(54) ACCUMULATOR BASED PHASE LOCKED LOOP

(75) Inventor: Ian Thompson, Christchurch (NZ)

(73) Assignee: Nokia Corporation, Espoo (FI)

( * ) Notice: Subject to any disclaimer, the term of this patent is extended or adjusted under 35 U.S.C. 154(b) by 531 days.

(21) Appl. No.: 10/488,549

(22) PCT Filed: Sep. 4, 2002

(86) PCT No.: PCT/IB02/03610

§ 371 (c)(1),
(2), (4) Date: May 5, 2004

(87) PCT Pub. No.: WO03/026133

PCT Pub. Date: Mar. 27, 2003

(65) Prior Publication Data

US 2005/0041766 A1 Feb. 24, 2005

(30) Foreign Application Priority Data

Sep. 7, 2001 (GB) .................... 0121713.2

(51) Int. Cl.
*H03D 3/24* (2006.01)
(52) U.S. Cl. .................. 375/376; 375/373; 375/375; 327/156; 327/159
(58) Field of Classification Search ......... 375/371–376; 327/155, 156, 159, 146, 147, 149, 151, 157
See application file for complete search history.

(56) References Cited

U.S. PATENT DOCUMENTS

| | | | | |
|---|---|---|---|---|
| 4,768,167 A | * | 8/1988 | Yoder | 365/156 |
| 4,817,197 A | * | 3/1989 | Shimizu et al. | 455/208 |
| 4,829,554 A | * | 5/1989 | Barnes et al. | 455/432.1 |
| 5,656,954 A | * | 8/1997 | Kondoh et al. | 326/115 |
| 5,905,388 A | * | 5/1999 | Van Der Valk et al. | 327/107 |
| 5,909,474 A | * | 6/1999 | Yoshizawa | 375/376 |
| 6,122,326 A | * | 9/2000 | Jackson et al. | 375/308 |
| 6,157,271 A | * | 12/2000 | Black et al. | 332/127 |
| 2002/0008588 A1 | * | 1/2002 | Khan | 331/18 |
| 2002/0089356 A1 | * | 7/2002 | Perrott et al. | 327/105 |

FOREIGN PATENT DOCUMENTS

DE 196 53 022 A1 6/1998

OTHER PUBLICATIONS

Hikawa et al, "A Digital Frequency Synthesizer with a Phase Accumulator", Transactions of the Institute of Electronics, Information and Communication Engineers of Japan, vol. E72, No. 6, Jun. 1, 1989, pp. 719-726.

Nieznan& Nacute et al, "Jitter Elimination in Accumulator-based Pulse Frequency Synthesiser", Electronics Letters, IEE Stevenage, vol. 33, No. 21, Oct. 9, 1997, pp. 1751-1752.

* cited by examiner

*Primary Examiner*—David C. Payne
*Assistant Examiner*—Rahel Guarino
(74) *Attorney, Agent, or Firm*—Squire, Sanders & Dempsey L.L.P.

(57) ABSTRACT

There is disclosed a phase locked loop comprising: a phase frequency detector for receiving as a first input a reference signal and for generating a control signal; a voltage controlled oscillator for receiving the control signal and for generating a signal defining an output frequency, a feedback path connecting the output signal to a second input of the phase frequency detector; and a digital accumulator for generating the reference signal under the control of an accumulator reference clock.

33 Claims, 8 Drawing Sheets

ACCUMULATOR BASED PHASE LOCKED LOOP

FIELD OF THE INVENTION

The invention relates particularly, but not exclusively, to an accumulator based, phase locked loop system, such as is typically used in a telecommunications system. However, the invention could equally be applied in other applications relying on a frequency synthesiser or a phase modulated signal source.

BACKGROUND OF INVENTION

Frequency synthesisers are an integral part of any modern communications system, especially any coherent system dependent upon a steady phase difference between each element in the communication network.

Advancing technology has made possible the use of adaptive beam steering using multiple antennas to provide a focused beam between transmitter and receiver systems, allowing the dual benefits of increased cell capacity with increased rejection of interfering signals. The ability to adjust the output phase of the frequency under digital base-band control is particularly useful as it can reduce the component count used in a transmitter system. Similarly a system which can accurately provide a phase modulated radio frequency signal offers the potential for higher levels of component integration.

Figure 1:
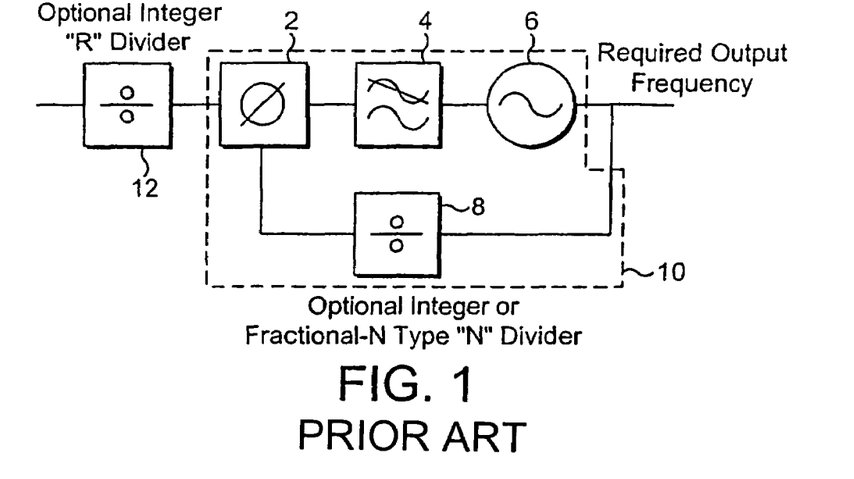
FIG. 1 illustrates a prior art phase locked loop.

Reference is made to FIG. 1, which shows a known synthesiser generally designated by reference numeral 10.

The synthesiser 10 comprises a phase detector 2, a low-pass filter 4, voltage controlled oscillator (VCO) 6, a divider 8, and an optional integer "R" divider 12. A signal having a required output frequency is generated at the output of the VOC 6.

Essentially there are two variants to this type of synthesiser, employing either fixed integer dividers or modulated dividers, by a suitably adjusted data stream, which constantly adjusts the integer divider value in the divider 8. Modulated dividers are also known as fractional-N dividers. The parasitic modulation of the divider output signal is itself modulated by this modulated data stream to ensure the remainder of the phase locked loop can remove this parasitic modulation, whilst preserving the advantages it offers.

Both types of phase locked loops use a phase frequency detector 2, which is commonly a digital element, to compare a fed back voltage controlled oscillator output with an incoming reference signal, to which the system is phase locked. The output of the phase frequency detector 2 can be a series of either current or voltage pulses, which are filtered by the loop filter 4 to give a small error voltage. This small error voltage complements the voltage pedestal at the output of the loop filter, ensuring the VCO remains phase locked. The error voltage is the correction voltage supplied to the VCO, to suppress the excess phase noise of this device to levels determined by the phase locked loop dynamic characteristics. The VCO is the device controlled by this negative feed back closed loop system. To provide a frequency translation back to the phase frequency detector 2, for comparison with the reference signal, the series divider circuit is used. If fractional-n dividers are used, as shown in FIG. 1, their mean division value can be adjusted to give an effective multiplication of the reference signal, hence allowing the phase locked system to change to different frequencies with respect to the reference signal.

Digital dividers have the net effect of raising the phase noise of the system because their dividing action in the feed back path of the system translates to a multiplication of PFD related noise in the through transfer characteristic of the phase locked loop.

Arrangements using digital dividers in their feed-back path offer limited noise performance preventing their simple implementation in new, more demanding, communication system applications.

Single loop fractional-N techniques, described earlier, have been adapted to improve on divider limitations by raising the sampling frequency seen at the digital phase frequency detector input to reduce these division values. However, a point is reached where the sampling frequency approaches half the synthesiser's output frequency (for a minimum division value of 2). Beyond this point only another 3 dB of improvement might be possible, although this still does not guarantee that the resulting in-band phase noise becomes acceptable.

Also known is the use of phase locked loops employing a mixer as a frequency translation element, in order to improve the in-band phase noise using a combination of analogue phase locked loops and direct digital synthesisers. In an alternative PLL arrangement, a mixer arrangement is used in place of the divider 8. When mixers are used, additional signal sources are required to provide this frequency translation. Mixers do not raise the in-band phase noise levels, because their action is to subtract two signals in the feed back path, giving no change in phase at the mixer output, and hence no adverse effect to a system which tracks only phase. A phase locked loop using a mixer has a minimal multiplication of any spurious energy injected into the reference input.

The direct digital synthesisers provide the necessary frequency interpolation required for attaining the specified frequency steps at the phase locked loop output. Reference is made to the Qualcom application note AN2334-4, (1990) and U.S. Pat. Nos. 4,965,533, and 5,184,093 on the subject.

Alternatively the direct digital synthesiser is applied to the phase frequency detector input, with a consequent spurious degradation seen at the phase locked loop output.

A phase locked loop possesses a typical transfer characteristic of a band-pass system. This band-pass is filter characteristic is centred about the output VCO's signal, which at high frequencies (given the low loop bandwidths of the phase locked loop) represents a very high "Q" factor that cannot be achieved any other way.

Figure 2:
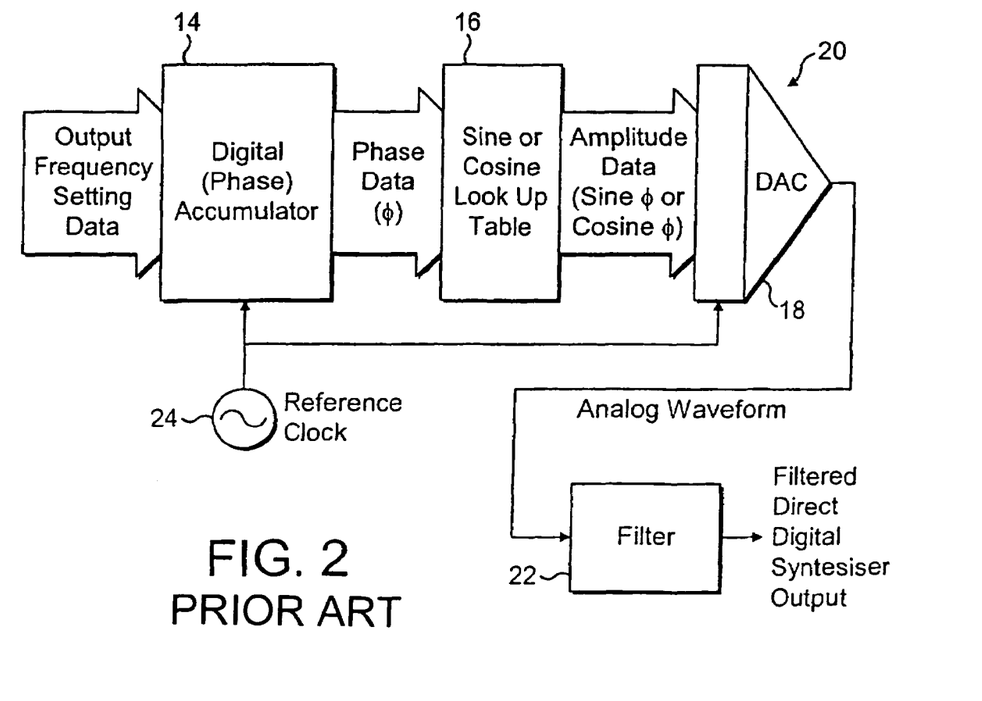
FIG. 2 illustrates a prior art direct digital synthesiser.

The alternative to analogue phase locked loops, as described herein above, are direct digital synthesisers. Direct digital synthesisers are not phase locked systems, as they do not possess a feedback path between their output and inputs. They are capable of open loop operation because their all-digital nature guarantees repeatable outputs under all conditions. They do not suffer from the vagrancies of analogue systems. The basic concept of direct digital synthesisers remains unchanged from the original paper presenting the idea given in 1971. As shown in FIG. 2, a direct digital synthesiser 20 is built up of three components; a digital (phase) accumulator 14, a sine (or cosine) look-up table 16, and a digital to analogue converter (DAC) 18. External to the direct digital synthesiser 20 is an analogue low pass or band pass filter 22. A reference clock 24 clocks the digital accumulator 14 and the DAC 18.

The purpose of the digital accumulator 14 is to digitally integrate the digital input word provided on an input thereto, resulting in a ramp output at the required frequency. This defines the digital input word as a phase value equivalent to the phase difference over one accumulator clock period to give the required output frequency. Every time the accumulator overflows the "carry out" bit is ignored and the accumulator output re-starts it's integration sequence, giving an output word pattern resembling a ramp. The length of the digital accumulator 14 determines the phase resolution available for each accumulator clock cycle and hence the accuracy of the output frequency. Using this concept of phase increments, the required digital input word for a given output frequency can be calculated using the expression:

$$\text{Input Accumulator Word} = \frac{F_{Required} \times 2^{Accumulator\ Length}}{F_{Accumulator\ Clock}}$$

In a practical system the length of the accumulator data word exceeds the resolution of the following sine look up table, therefore only the "P" most significant bits are fed into the sine look up table. The value of "P" depends upon the combined width of the sine look up table and any compression circuitry used to mirror and invert the output of the sine look-up table output. It is the function of the sine look-up table 16 to convert the truncated accumulator equivalent phase value to a digital equivalent amplitude value, using a sine or cosine transfer characteristic. This digital amplitude is converted into an analogue signal level using a digital to analogue converter 18 clocked at the same frequency as the digital accumulator 14. In some direct digital synthesiser designs additional pipelining circuitry may be added to overcome circuit settling times allowing higher frequencies of operation. There is no effect on the quality of the output signal, with such pipelining only a slight phase delay is incurred between a change in digital input to analogue output.

Direct digital synthesisers are comprised of all digital elements making them suitable for integration into a chip. However one major performance limitation is the digital-to-analogue converter at the output. This digital-to-analogue converter generates problems; reducing the spurious free dynamic range and raising the noise floor. To minimise these effects caused by sampling and aliasing during the digital-to-analogue converter operation, the passive reconstruction filter 22 is normally used to "clean-up" the signal before it is used in the remainder of the system it is employed to drive.

Direct digital synthesisers cannot operate at the required local oscillator frequencies of contemporary mobile communication systems with the necessary noise and spurious performance. Therefore in current known solutions direct digital synthesisers are combined with analogue or digital phase locked loop techniques, to perform the necessary up-conversion of their lower frequency signals.

As described hereinabove, any phase locked loop employing a digital divider in its feedback path possesses gain. Therefore any small direct digital synthesiser related spurious products would be subject to this gain, usually raising their level to unacceptable levels. Analogue loops using only a mixer in the feedback path have no such gain, giving a unity translation of input DDS spurious levels.

It is an aim of the present invention to provide a solution which overcomes the above-stated problems.

SUMMARY OF THE INVENTION

In accordance with the present invention, there is provided a phase locked loop comprising: a phase frequency detector for receiving as a first input a reference signal and for generating a control signal; a voltage controlled oscillator for receiving the control signal and for generating a signal defining an output frequency, a feedback path connecting the output signal to a second input of the phase frequency detector; and a digital accumulator for generating the reference signal under the control of an accumulator reference clock.

Preferably there is further provided a summer having a first input connected to the output of the phase frequency detector and an output connected to the input of the voltage controlled oscillator, and a digital to analogue converter having a first input connected to the output of the digital accumulator, a second input of the summer being connected to the output of the digital to analogue converter.

Preferably the digital to analogue converter is clocked by a clock signal derived from dividing the accumulator reference clock.

The digital to analogue converter may be connected to the digital accumulator via a latch. The latch may be clocked by the clock signal derived from the accumulator reference signal.

The accumulator reference clock may be divided on input to the accumulator. The digital to analogue converter may be connected to the digital accumulator via a look-up-table. The look-up-table may be one of either a sine look-up-table or a cosine look-up-table.

The phase detector circuit may receive a further reference signal from the digital accumulator.

The reference signal may be provided by the most significant bit of the digital accumulator, and the further reference signal is provided by at least one further bit of the digital accumulator.

The most significant bit may be provided to the phase detector via a divider, and the at least one further bit is provided to the phase detector by a latch. The latch may be clocked by a divided version of the accumulator reference clock.

The feedback path may be provided by a divider.

The accumulator reference clock may be provided by a reference clock generator.

The feedback path may be provided by a mixer. The mixer may receive as a first input the signal defining the output frequency and as a second input the accumulator reference clock. The accumulator reference clock may be generated by a further phase locked loop. The further phase locked loop may generate the accumulator clock as its output signal and receives a reference clock signal as the input reference signal. The digital accumulator may receive the accumulator reference clock, and the mixer receives a further accumulator reference clock. The accumulator reference clock and the further accumulator reference clock may be provided by first and second further phase locked loops.

The further phase locked loop circuit may comprise a reference divider for receiving a reference clock signal, a phase detector connected to receive the output of the reference divider, and a voltage controlled oscillator connected to receive the output of the phase detector, the output of the voltage controlled oscillator forming the second input to the mixer and the clock input for the digital accumulator, there further being a feedback path from the output of the voltage controlled oscillator to the phase detector of the reference generating circuit.

The feedback path may comprise a divider.

There may further be provided a low pass filter at the input to the voltage-controlled oscillator of the further phase locked loop.

The digital accumulator may receive as an input a digital frequency input word.

There may further be provided a low pass filter at the input of the voltage-controlled oscillator.

There may further be provided an IF filter at the output of the mixer.

A mobile communication system may include a phase locked loop as described. A mobile telephone handset may include a phase locked loop as described. An integrated circuit may include a phase locked loop as described.

The invention uses a variety of commonly available elements to derive a frequency synthesiser based system optimised for phase noise and lock time. Particular attention has been given to optimising the application of each element within the system so they serve their purpose without duplication. This invention relates to a variety of systems all using a digital accumulator core. The second part of this invention relates to using digital dividers to offset some of the limitations of this technique. The applicability of these dividers and their obvious advantages applies equally to other existing applications of direct digital synthesisers.

This invention offers both static phase coherency and dynamic phase adjustment.

BRIEF DESCRIPTION OF THE FIGURES

The invention will now he described with reference to the accompanying Figures, in which.

DESCRIPTION OF PREFERRED EMBODIMENTS

Figure 3:
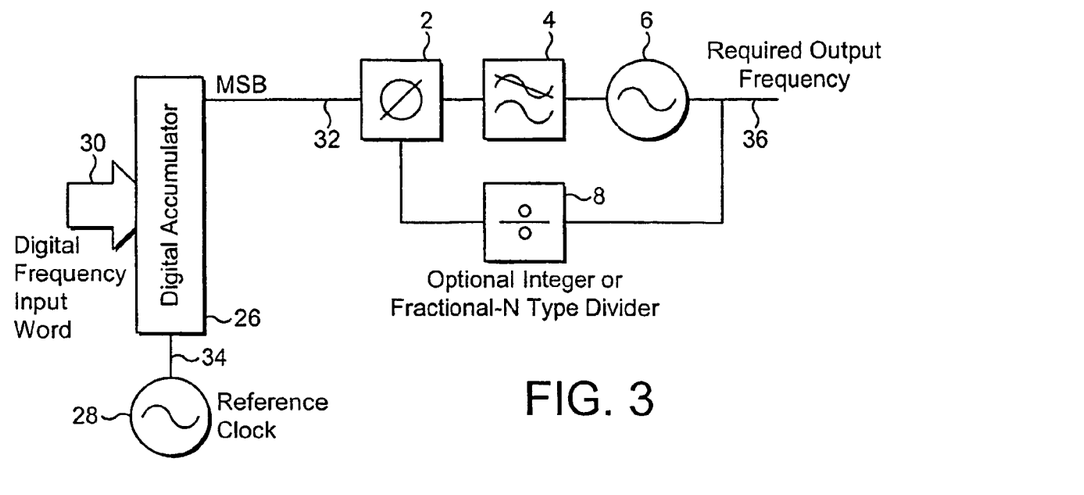
FIG. 3 illustrates a simple phase locked loop in accordance with the present invention.

Referring to FIG. 3 there is illustrated a first example implementation of the present invention in a simple phase locked loop. The simple phase locked loop refers to the PLL 10 of FIG. 1. In accordance with the present invention, there is additionally provided a digital accumulator 26 and a phase locked reference clock source 28. The digital accumulator 26 additionally receives frequency input word 30. A single bit of the digital accumulator 26, the most significant bit MSB on line 32, forms the input to the PLL 10. The input to the PLL 10 is the reference input to a single bit, digital phase frequency detector 2. The required output frequency is generated on an output line 36 of the PLL 10. It should be noted that the digital accumulator 26 and reference clock 28 of FIG. 3 correspond to the digital accumulator 14 and reference clock 24 of FIG. 2.

Figure 4:
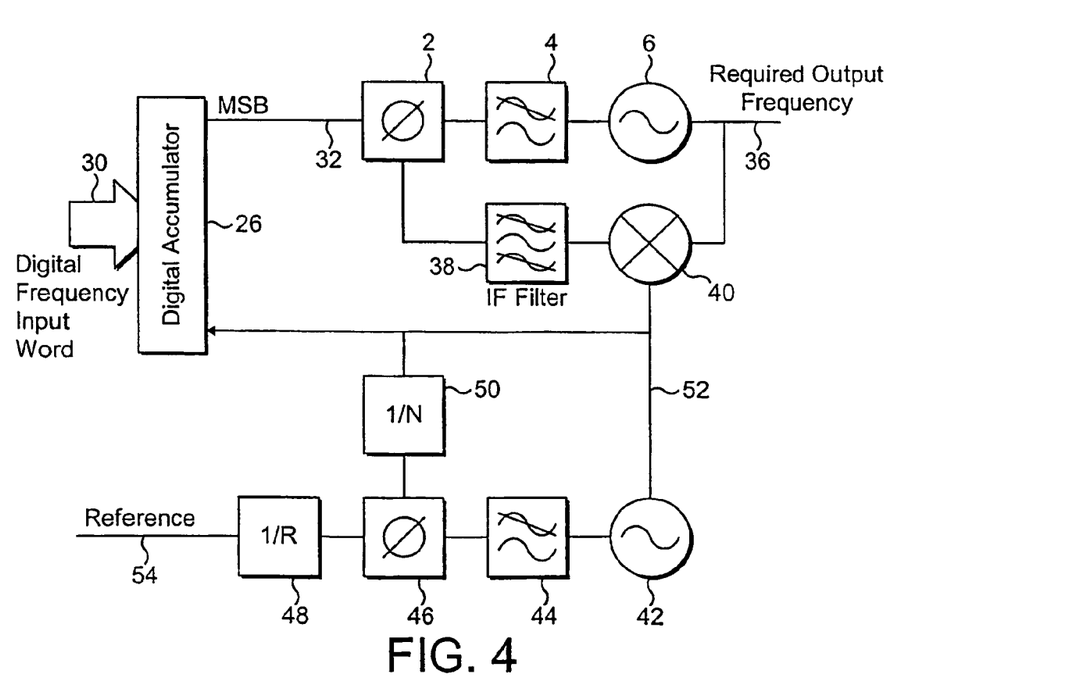
FIG. 4 illustrates a mix-down phase locked loop in accordance with the present invention.

Referring to FIG. 4, there is shown a further example of the implementation of the present invention in a mix-down phase locked loop. Referring to FIG. 41 the mix-down phase locked loop includes the phase frequency detector 2, low pass filter 4 and VCO 6 of the simple phase locked loop of FIG. 1. The divider 8 of the phase locked loop of FIG. 1 is replaced by an IF filter 38 and a mixer 40. The feedback input to the phase frequency detector 2 is provided from the required output frequency 36 via the mixer 40 and the filter 38 in series. A further input to the mixer 40 is provided on line 52 from a further voltage controlled oscillator 42. A reference signal 54 provides an input to a divider 48 having a divider ratio of 1/R. The output of the divider 48 forms an input to a phase frequency detector 46. The output of the phase frequency detector 46 is presented to a low-pass filter 44, which drives the VCO 42 to generate the signal 52. The signal 52 is additionally fed through a divider 50 having a divider ratio of 1/N to provide the second input to the phase frequency detector 46. The signal on line 52 additionally provides a clock signal to the digital accumulator 26, which is configured in the same way as the digital accumulator 26 of FIG. 3. Thus in FIG. 4 the digital accumulator 26 receives a digital frequency input word 30 and generates a single signal providing the most significant bit stored in the digital accumulator 26, on line 32.

The synthesisers described herein in accordance with the invention with reference to FIGS. 3 and 4 use a digital accumulator to provide a correct frequency-interpolated output signal through the most significant bit of the digital accumulator 26. This "most significant bit" signal MSB contains the correct mean frequency as well as a strong unwanted phase modulation, since the remainder of the phase information remains untouched in the phase accumulator. Normally, a direct digital synthesiser uses the "P" most significant bits available in the digital phase accumulator to drive the remainder of the device, preserving much of the available phase information.

With this simple scheme as illustrated in FIGS. 3 and 4 there is a problem associated with reducing the strong spur energy found at different, well defined input clock to output frequency ratios. This problem is due to the single most significant bit value only containing the phase values of 0° or 180° necessary to drive the single bit, digital phase frequency detector. To overcome this problem, in a preferred embodiment as described herein below, with reference to FIGS. 5 and 6, the invention uses a combination of digital dividers and digital-to-analogue converters to compensate for this excess spur energy.

Figure 5:
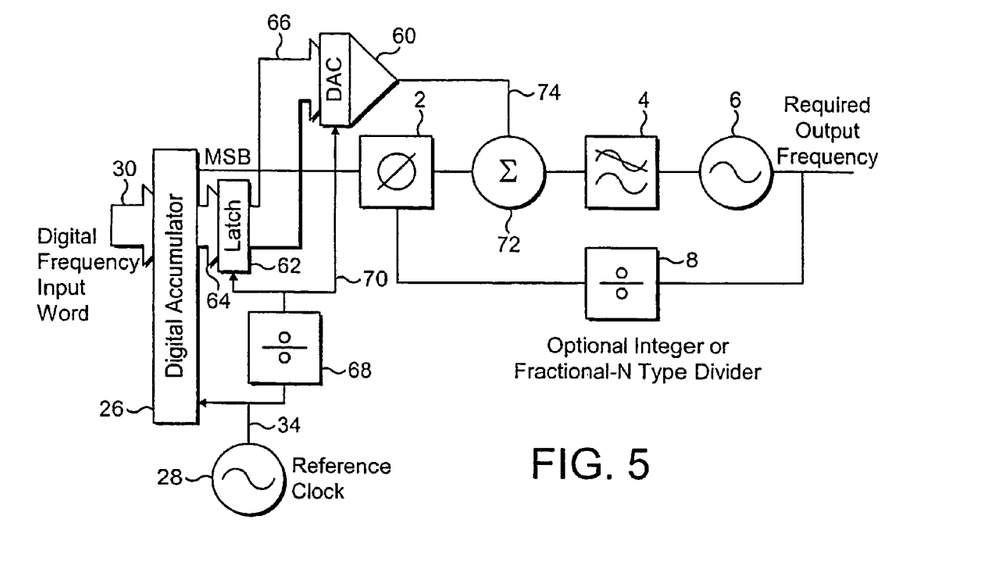
FIG. 5 illustrates the phase locked loop of FIG. 3 with compensation.
Figure 6:
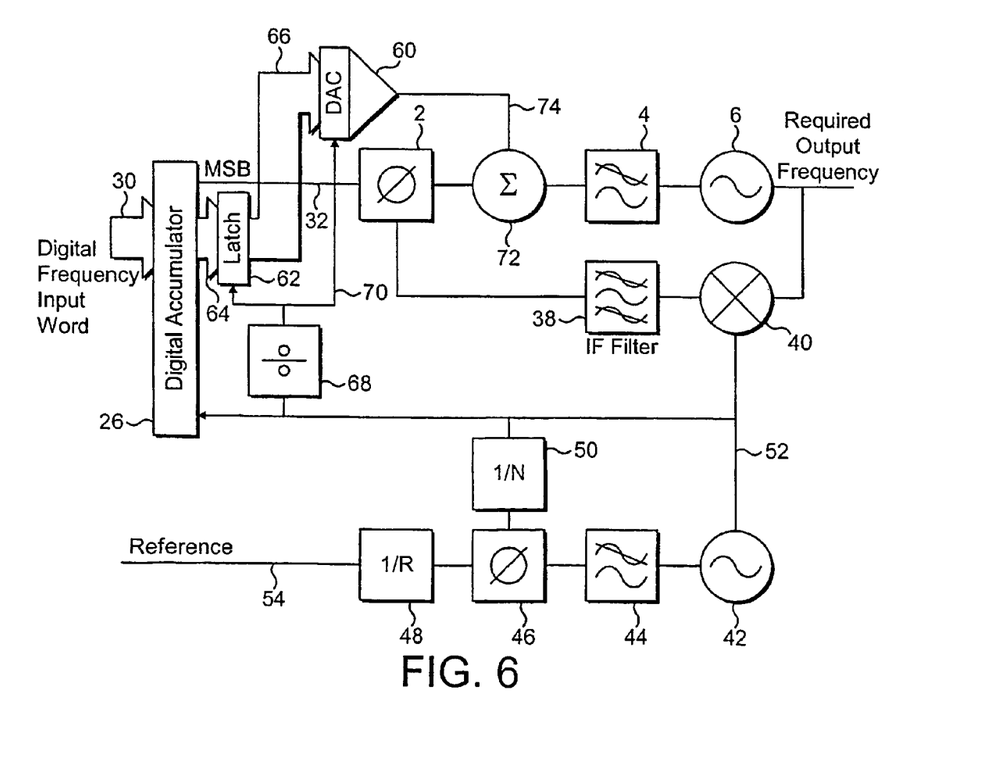
FIG. 6 illustrates the phase locked loop of FIG. 4 with compensation.

FIGS. 5 and 6 illustrate how the digital phase information available in the digital accumulator may be directly fed into a digital-to-analogue converter. The phase information may also be sub-sampled and fed into a digital-to- analogue converter to reduce the digital-to-analogue converters operating frequency at higher accumulator operating frequencies.

Referring to FIG. 5, there is illustrated an example implementation of the simple phase locked loop of FIG. 3 according to the invention with a further modification to include phase compensation. Thus the arrangement of FIG. 5 further includes a latch 62, a digital-to-analogue converter 60 and, as will be further described herein after, a divider 68. A digital word is output from the digital accumulator on line 64, representing the phase of the digital word stored in the digital accumulator 26. The output digital word is latched into a latch 62, which on its output provides a word 66 which forms an input to the digital-to-analogue converter 60. The digital-to-analogue converter 60 provides an analogue signal on line 74 representing the phase of the digital word stored in the digital accumulator 26. This analogue signal is provided to a summing unit 72 which removes the phase value from the signal at the output of the phase frequency detector 2.

The latch 62 and digital-to-analogue converter 60 may be clocked directly by the clock signal on line 34 generated by the reference clock 28. However in a preferable implementation of the invention, and as discussed in further detail herein below, the clock signal on line 34 may be divided by the divider 68 to generate a reduced clock on line 70 for clocking both the latch 62 and the digital-to-analogue converter 60.

FIG. 6 illustrates an example implementation of the mixed-down phase locked loop of FIG. 4 according to the present invention with phase compensation included. The modification to FIG. 6 relative to FIG. 4 is identical to the modification of FIG. 5 relative to FIG. 3, and therefore a detailed explanation to the modifications is not given here. It will be apparent from referring to FIG. 6 that the latch 62, digital-to-analogue converter 60, summing unit 72, and divider 68 are introduced into the circuit of FIG. 4 in exactly the same manner as they are introduced into the circuit of FIG. 3 to provide phase compensation.

There are some integer frequencies at which the digital information being passed into the digital-to-analogue converter are not able to correctly compensate for the modulation available on the "MSB" data bit. To overcome this problem the divider 68 feeding the digital-to-analogue converter is adjusted for those frequencies.

The preferable lower frequency digital-to-analogue converter 60, clocked by reduced clock signal 70, serves to sub-sample the Phase information available in the digital accumulator and apply this information as a correction to the output of the phase frequency detector 2 in the analogue phase locked loop. For lower frequency applications, the digital-to-analogue converter need not sub-sample the accumulator's contents and the accumulator contents may be fed directly into the digital to analogue converter and the latch 62 and the divider 68 not utilised.

The data output from the sub-sampled digital accumulator 26 may, in a further modification, be fed through a simple passive-shaping look up table or active noise shaping element, to reduce the spurious energy parasitic to the digital to analogue conversion operation. This noise shaping entity could also use the most significant bit MSB as one of it's inputs.

One distinct advantage of digital accumulators is their inherent ability of produce absolute frequencies with frequency resolutions limited only by the accumulator length. Therefore as a means of minimising spur problems adjustable digital dividers can be additionally used to divide down the master clock frequency into the accumulator, as is illustrated by FIGS. 7 and 8.

Figure 7:
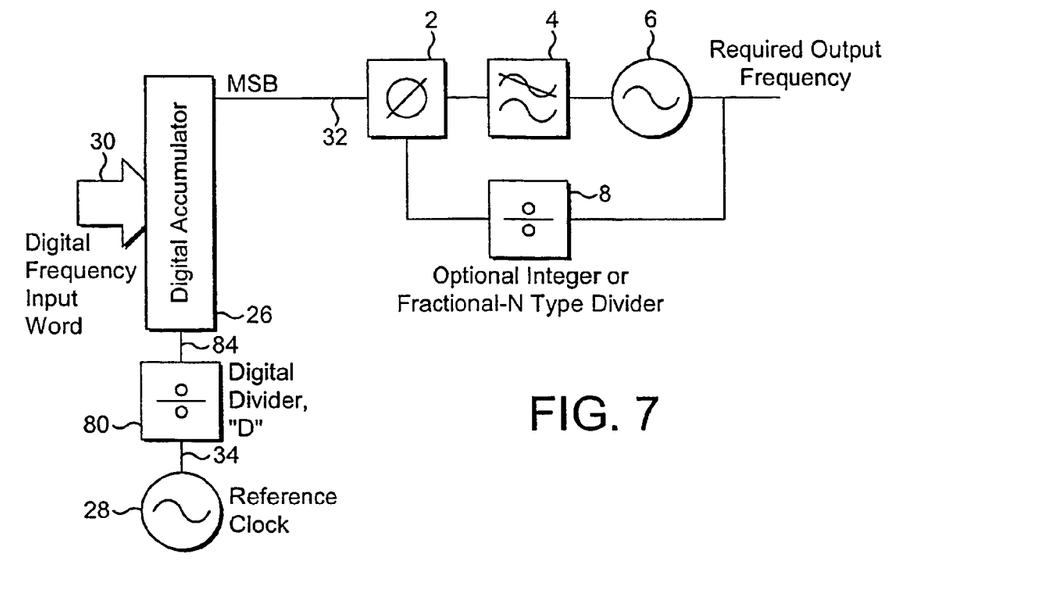
FIG. 7 illustrates the phase locked loop of FIG. 3 with a digital divider.

Referring to FIG. 7 there is illustrated the simple phase locked loop of FIG. 3 incorporating such an additional divider. As can be seen from FIG. 7, a digital divider 80 is introduced between the reference clock 28 and the clock input of the digital accumulator 26. Thus a divided clock signal is provided by the digital divider 80 on line 84 from the reference clock signal on line 34. Referring to FIG. 8 there is similarly illustrated a modification to the mixed-down phased locked loop of FIG. 4 to include an additional divider. Again, the digital divider 80 is provided to divide down the clock signal 52 to provide a reduced clock signal 82 to the digital accumulator 26.

Figure 8:
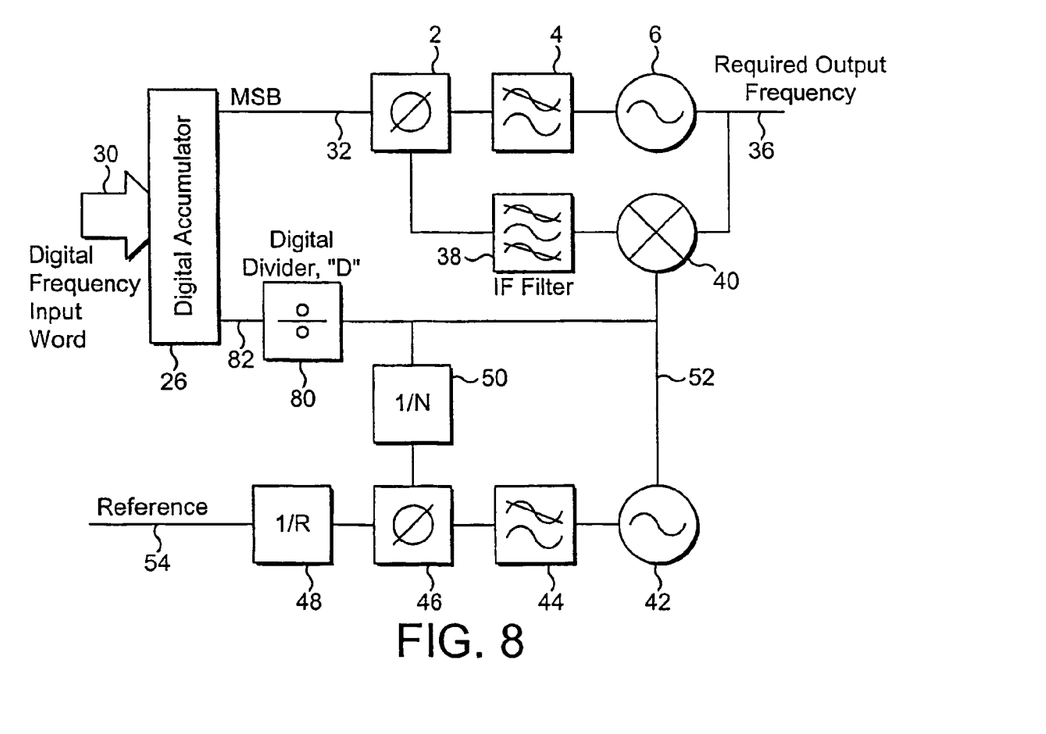
FIG. 8 illustrates the phase locked loop of FIG. 4 with a digital divider.

It is necessary for the frequency word 30 programmed into the digital accumulator 26 to be modified to accommodate a division value D in the digital divider 80 of FIGS. 7 and 8 and still provide a final output frequency.

The digital divider 80 effectively changes the clock frequency driving the accumulator 60, thereby altering the positions of the inter-multiplication products responsible for spurious products. This technique enables the strongest of these products to be avoided, but does not remove them in all cases. The modification to the formula given earlier above is:

$$\text{Input Accumulator Word} = \frac{\frac{F_{Required}}{D} \times 2^{Accumulator\ Length}}{F_{Accumulator\ Clock}}$$

Where "D" is the preceding reference clock division value, i.e. the division value of the divider 68.

Using the digital divider 80, has the advantage of reducing the overall clock frequency of the digital accumulator 26 whilst still reducing the stronger spur levels of higher frequency accumulators. This is made possible because the divider 80 can be adjusted for each frequency to ensure the stronger accumulator spur "hot spots" are avoided.

Reducing the clocking frequency of the digital accumulator has the additional distinct advantage of reducing the overall system power during normal operation.

Figure 9:
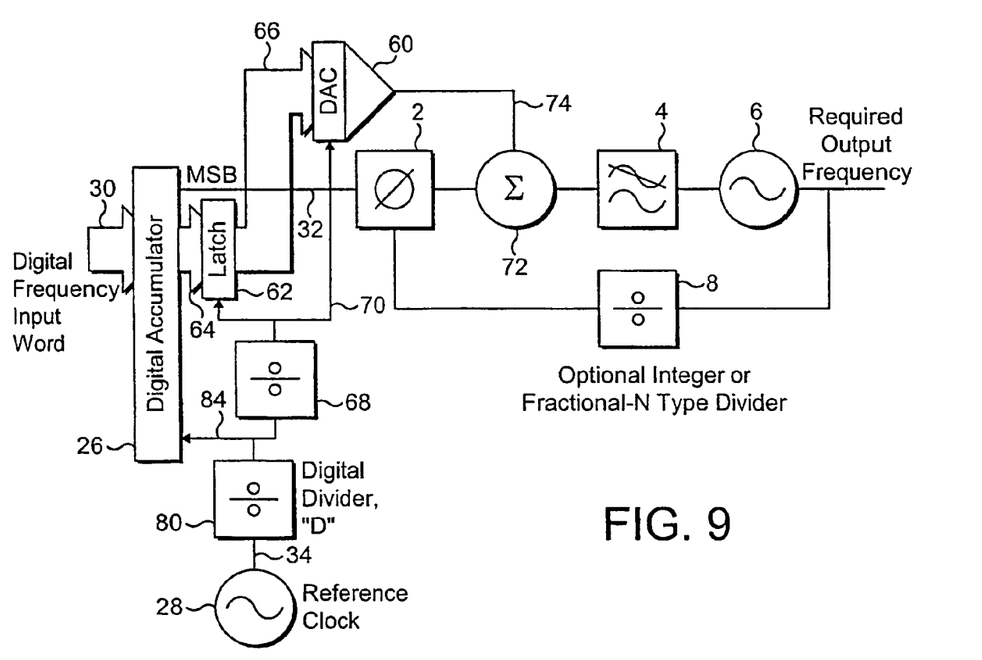
FIG. 9 illustrates a combination of the phase locked loops of FIGS. 5 and 7.

The advantageous divider as illustrated with reference to FIGS. 7 and 8 can be additionally and advantageously included in the phase compensation arrangements for FIGS. 5 and 6. Referring to FIG. 9, there is illustrated a preferable implementation of the simple phase locked loop arrangement with phase compensation as shown in FIG. 5 further incorporating the digital divider as shown in FIG. 7. As can be seen from FIG. 9, the effect of the digital divider in such an arrangement is to reduce the clock signal not only to the digital accumulator 26, but additionally to the latch 62 and to the digital-to-analogue converter 60.

Figure 10:
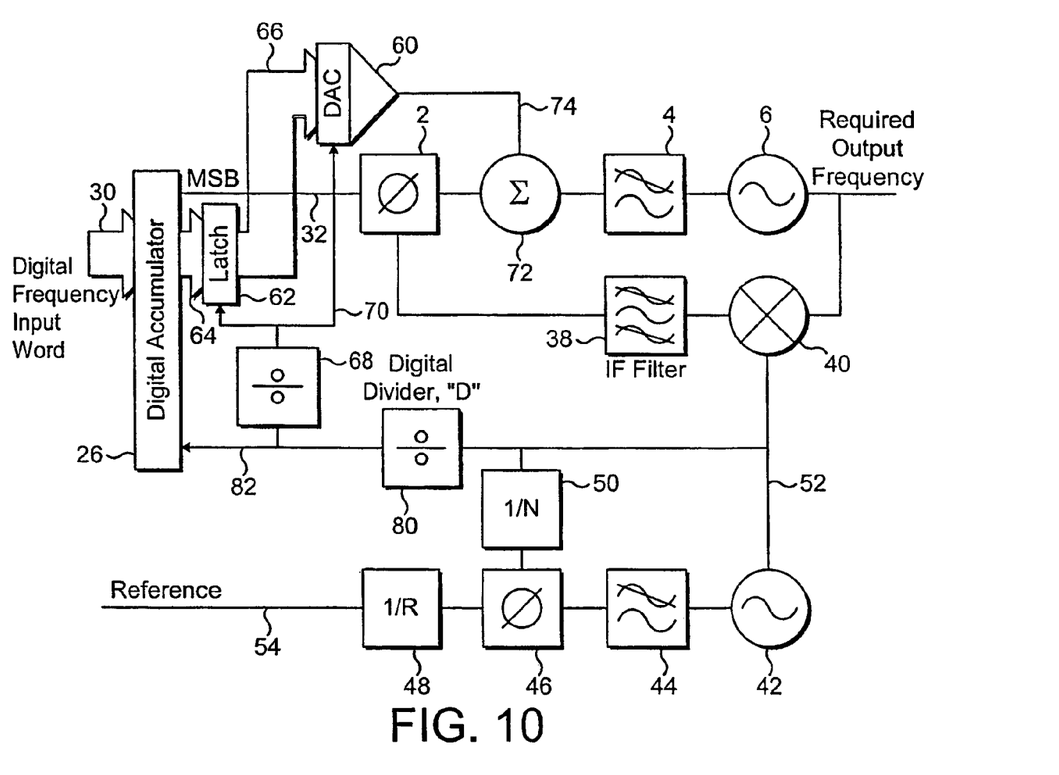
FIG. 10 illustrates a combination of the phase locked loops of FIGS. 6 and 8.

Referring to FIG. 10, there is similarly shown the introduction of the digital divider 80 of FIG. 8 introduced into the mix-down phase locked loop with compensation as shown in FIG. 6. As for FIG. 9, the digital divider 80 results in a reduced clock signal being applied to the digital accumulator 26 as well as the latch 62 and digital-to-analogue converter 60. It will be apparent from the foregoing description and from referring to FIGS. 9 and 10, that the clock signal applied to the latch 62 and the digital-to-analogue converter 60 is further reduced by the divider 68 when the divider 68 is utilised.

The position of the frequency spurs bears a simple relationship with the master clock (ie the reference clock 28) frequency, which can be calculated using the accepted inter-modulation formula:

Spur Frequencies=$\pm N \times F_{Accumulator} \pm M \times F_{Digital\ Equivalent\ Output\ Frequency}$ Where N and M are integers.

What are the integers N and M—how are they derived/determined. The integers n and m range from negative to positive offsets. For example, n is kept at a particular integer value within the offsets, whilst m is varied across the offsets. This is done for every value of n, and in this way a graphical table of values can be established. In this way, the above equation may be used to predict where spur energies will fall for any given output frequency.

Figure 11:
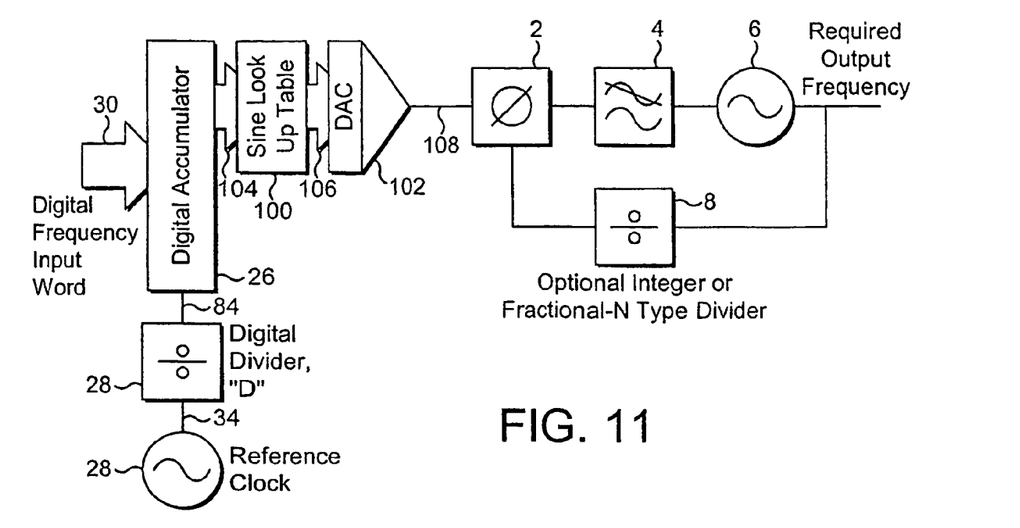
FIG. 11 illustrates a direct digital synthesiser phase locked loop with a digital divider according to the present invention.

The principle of utilising a digital divider to reduce the clock frequency of the digital accumulator 26 and thereby minimise frequency spurs can also be applied to direct digital synthesisers. Referring to FIG. 11, there is illustrated the simple phase locked loop with digital divider as shown previously in FIG. 7 further adapted to include a direct digital synthesiser for generating the input to the phase frequency detector 2. Referring to FIG. 11, the digital accumulator 26 generates an output word 104 which forms an input to sine look-up table 100. The sine look-up table generates an output word 106 to a digital-to-analogue converter 102 which provides an analogue signal on line 108 to the phase frequency detector 2. The implementation of such a direct digital synthesiser utilised in the digital accumulator 26, the sine look-up table 100, and the digital-to-analogue converter 102 is well known in the art.

Figure 12:
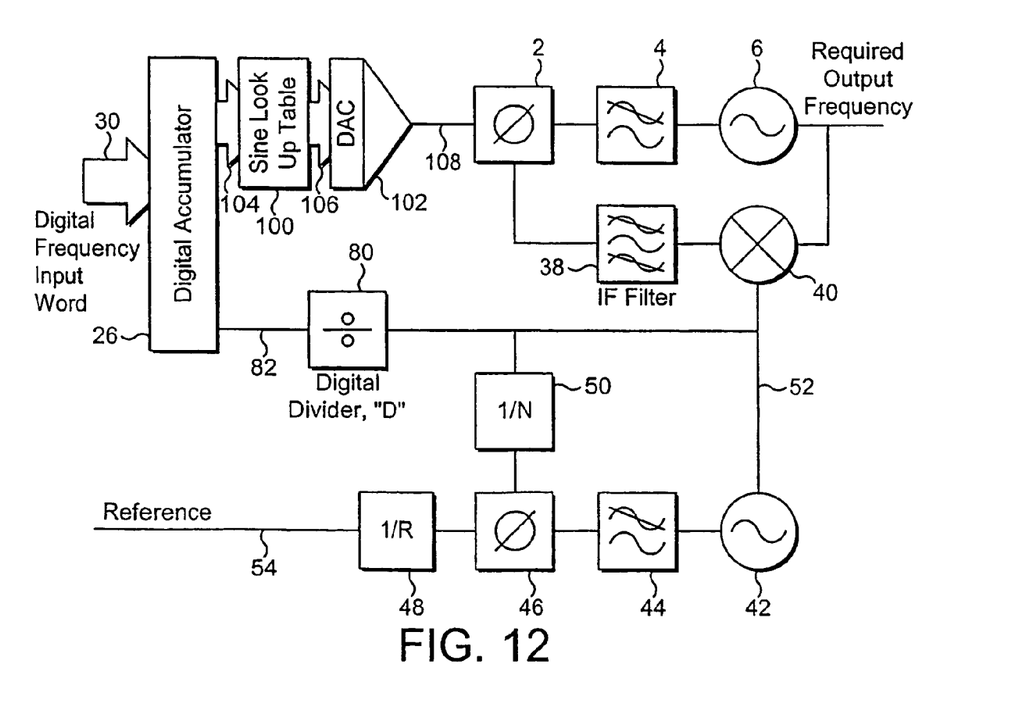
FIG. 12 illustrates a direct digital synthesiser mix-down phase locked look with a digital divider according to the present invention.

Similarly referring to FIG. 12, the mix-down phase locked loop including the additional divider for reducing the clock signal to the digital accumulator 26 of FIG. 8 is adapted as shown in FIG. 12 to include the sine look-up table 100 and the digital-to-analogue converter 102 to generate the signal on line 108 to the phase frequency detector 102.

When the output frequency of the digital accumulator 26 is known to fall close to one of the problem frequencies, determined using the expression for spur frequencies stated above, the digital divider 80 is reprogrammed. This requires the digital accumulator 26 to also be reprogrammed to synthesise another frequency which is removed from the vicinity of the known problem frequency. Consequently, the output frequency of the digital accumulator 26 will be correct to drive the phase locked loop, but will possess lower unwanted spur energy.

In an alternative arrangement the digital-to-analogue converter 60 of FIGS. 5 and 6 (or FIGS. 9 and 10) could be replaced (or supplemented) using a suitable digital phase frequency detector which accepts a constant update of (sub-sampled) phase information from the digital accumulator 26, as part of its operation.

Figure 13:
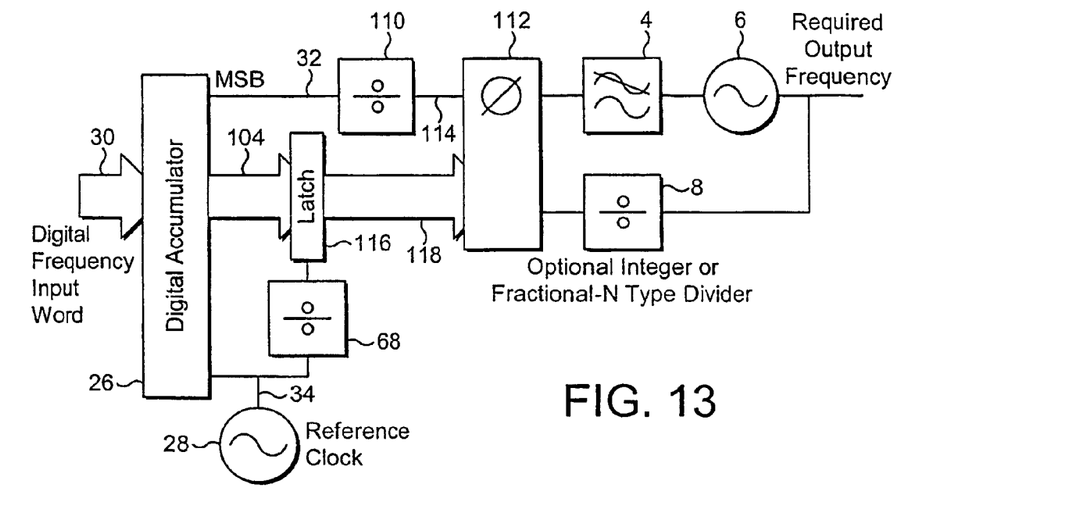
FIG. 13 illustrates a phase locked loop with a complex digital phase frequency detector according to the present invention.
Figure 14:
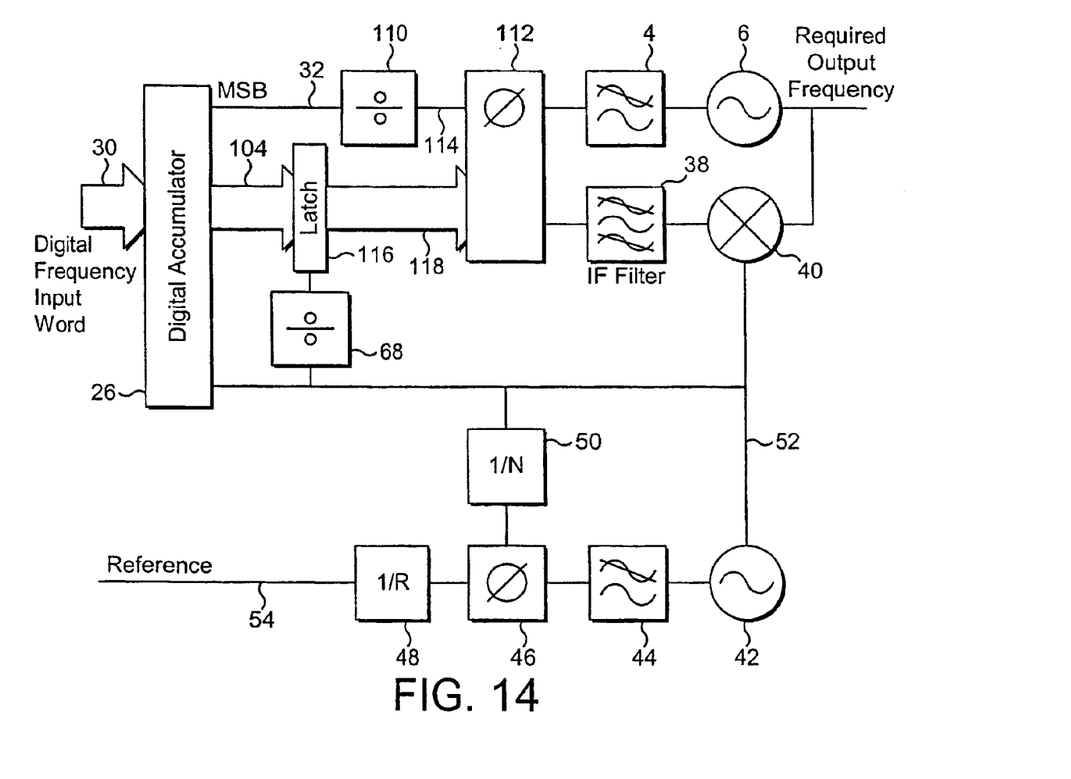
FIG. 14 illustrates a mix-down phase locked loop with a complex digital phase frequency detector according to the present invention.

Such an alternative arrangement is illustrated in FIGS. 13 and 14. Referring to FIG. 13, the direct digital synthesiser phase locked loop including the digital divider as shown in FIG. 11 is modified to include a divider 110 and a complex digital phase frequency detector 112 and the latch 116 in place of the sine look-up table 100 and the digital-to-analogue converter 102 and the phase frequency detector 2. Referring to FIG. 13, the digital accumulator 26 outputs a digital word 104 to a latch 116, which in turn provides digital word 118 to the complex digital phase frequency detector 112. In addition the digital accumulator 26 outputs the most significant bit of the word stored therein on line 32 to the divider 110 which provides a divider signal on line 114 to the complex digital phase frequency detector 112. The digital accumulator 26 is clocked by the reference clock signal on line 34, the latch 116 is clocked by a divided reference clock signal, provided by the divider 68 dividing the reference clock signal on line 34.

The direct digital synthesiser mix-down phase locked loop of FIG. 12 may be similarly adapted to include the latch 116, divider 110, and complex digital phase frequency detector 112, as shown in FIG. 14.

Digital phase information is continuously loaded into the phase frequency detector 112, where the value is compared to the current phase offset it has determined allowing it to decide an output value. Using the more complex digital phase frequency detector 112, it is possible to utilise more of the data values available in the digital accumulator without using (or supplementing) the DAC.

Important to the invention is the integration of each element's functionality within the system to avoid unnecessary duplication. Using only the digital accumulator 26 as shown in FIGS. 13 and 14 removes the high frequency digital-to-analogue converter 102 and sine look-up table 100 (and the optional reconstruction filter), all of which are difficult to implement at high clock speeds. Instead the analogue phase locked loop of FIGS. 13 and 14 acts like a parametric sine look-up table, high frequency digital-to-analogue converter and tracking reconstruction filter, by translating the phase information available in the digital accumulator 26 through the VCO 6, within the analogue phase locked loop, to the required output frequency. The analogue phase locked loop acts as a self-oscillating sinusoidal output, as well as a high "Q" factor tracking reconstruction filter. One particular advantage is the output signal of the analogue phase locked loop is not limited to Nyquist sampling theory, as a direct digital synthesiser driven digital-to-analogue converter would be. Thereby an excellent signal-to-noise ratio is preserved. The total system becomes a digital and analogue hybrid circuit, using the easiest equivalent analogue or digital block necessary to complete the system.

In each of the above example implementations of the present invention a mix-down approach has been included with the digital divider approach. Using the mix down approach in the analogue phase locked loop removes sufficient closed loop gain reducing the amplification of digital phase/frequency detector noise and any residual spur energy. Therefore, in contrast to the low loop bandwidths used in standard phase locked loops, this loop requires a large loop bandwidth (which is ideal for very fast lock times) to minimise the overall phase noise profile seen at the output.

In the examples given hereinabove illustrating the invention being utilised in a mix-down approach, a single PLL is shown providing the clock signal to the accumulator 26 and the mixer 40. However the invention is not limited to such an arrangement. In one alternative, the respective clock signals provided to the accumulator 14 and the mixer 40 may be provided by separate PLLs, each driven by a common reference signal.

For all the above examples the input to the digital accumulator 26 can be used for absolute phase adjustment of the analogue output signal. Alternatively it can be used for phase modulating this output signal to accurately reproduce any phase modulated output at much higher frequencies. This phase modulation capability could also be used to introduce noise shaping into the system to reduce the spur energy still further. Any sigma delta or noise dithering scheme could be employed.

It should be noted that the invention has been described herein with reference to particular examples. The invention is limited in its scope by the appended claims, and the applicability of the present invention may be broader than that as discussed above in the examples given.

The invention claimed is:

1. An apparatus comprising:
   a phase frequency detector configured to receive at a first input a reference signal and to generate a control signal at an output;
   a voltage controlled oscillator configured to receive at an input a signal based on the control signal and to generate at an output a signal defining an output frequency;
   a feedback path configured to connect the output of the voltage controlled oscillator to a second input of the phase frequency detector;
   a digital accumulator configured to generate the reference signal at a first output under the control of an accumulator reference clock signal;
   a summer having a first input connected to the output of the phase frequency detector and an output connected to the input of the voltage controlled oscillator; and a digital to analogue converter having an input connected to a second output of the digital accumulator, a second input of the summer being connected to an output of the digital to analogue converter, wherein the digital to analogue converter is clocked by a clock signal derived from dividing the accumulator reference clock signal.

2. An apparatus according to claim 1, wherein the input of the digital to analogue converter is connected to the output of the digital accumulator via a latch.

3. An apparatus according to claim 2, wherein the latch is clocked by the clock signal derived from dividing the accumulator reference signal.

4. An apparatus comprising:
a phase frequency detector comprising first, second and third inputs and an output, the phase frequency detector configured to generate a control signal at the output;
a voltage controlled oscillator configured to receive a signal based on the control signal and to generate at an output a signal defining an output frequency;
a feedback path configured to connect the output of the voltage controlled oscillator to the third input of the phase frequency detector;
a digital accumulator configured to generate first and second signals under the control of an accumulator reference clock signal, the first signal being provided by the most significant bit of the digital accumulator, the second signal being provided by at least one further bit of the digital accumulator, the first signal being provided to the first input of the phase frequency detector via a divider, and the second signal being provided to the second input of the phase frequency detector via a latch.

5. An apparatus according to claim 1, wherein the input of the digital to analogue converter is connected to the output of the digital accumulator via a look-up-table.

6. An apparatus according to claim 5, wherein the look-up-table is one of either a sine look-up-table or a cosine look-up-table.

7. A phase locked loop, comprising:
a phase frequency detector configured to receive as a first input a reference signal and to generate a control signal;
a voltage controlled oscillator configured to receive the control signal and to generate an output signal defining an output frequency, a feedback path connecting the output signal to a second input of the phase frequency detector;
a digital accumulator configured to generate the reference signal under the control of an accumulator reference clock, wherein the phase frequency detector circuit receives a further reference signal from the digital accumulator, the reference signal is provided by the most significant bit of the digital accumulator, the further reference signal is provided by at least one further bit of the digital accumulator, the most significant bit is provided to the phase frequency detector via a divider, and the at least one further bit is provided to the phase frequency detector by a latch.

8. A phase locked loop according to claim 7, wherein the latch is clocked by a divided version of the accumulator reference clock.

9. An apparatus according to claim 1, wherein the feedback path comprises a divider.

10. An apparatus according to claim 1, wherein the accumulator reference clock signal is provided by a reference clock generator.

11. An apparatus according to claim 1 wherein the feedback path comprises a mixer.

12. An apparatus according to claim 11, wherein the mixer is configured to receive at a first input the signal defining the output frequency and at a second input the accumulator reference clock signal.

13. An apparatus according to claim 11, wherein the accumulator reference clock signal is generated by a phase locked loop.

14. An apparatus to claim 13, wherein the phase locked loop is configured to receive a further reference clock signal at an input and to generates the accumulator reference clock signal at an output.

15. An apparatus according to claim 11, wherein the digital accumulator is configured to receive the accumulator reference clock signal, and the mixer is configured to receive at a first input the signal defining the output frequency and at a second input a further reference clock signal.

16. An apparatus according to claim 15, wherein the accumulator reference clock signal and the further reference clock signal are provided by first and second phase locked loops.

17. A phase locked loop, comprising:
a first phase frequency detector configured to receive as a first input a reference signal and to generate a control signal;
a first voltage controlled oscillator configured to receive the control signal and for generating an output signal defining an output frequency, a first feedback path connecting the output signal to a second input of the first phase frequency detector, wherein the feedback path is provided by a mixer; and
a digital accumulator configured to generate the reference signal under the control of an accumulator reference clock signal generated by a further phase locked loop,
wherein the further phase locked loop comprises a reference divider configured to receive a reference clock signal, a phase detector connected to receive an output of the reference divider, and a second voltage controlled oscillator connected to receive an output of the phase detector, an output of the second voltage controlled oscillator forming an input to the mixer and the accumulator reference clock signal, there further being a second feedback path from the output of the second voltage controlled oscillator to the phase detector.

18. A phase locked loop according to claim 17, wherein the second feedback path comprises a divider.

19. A phase locked loop according to claim 17, wherein there is further provided a low pass filter at the input to the second voltage controlled oscillator.

20. A phase locked loop according to claim 17 in which the digital accumulator receives as an input a digital frequency input word.

21. A phase locked loop according to claim 17 wherein there is further provided a low pass filter at the input of the first voltage controlled oscillator.

22. An apparatus according to claim 11 wherein the feedback path comprises an intermediate frequency filter at an output of the mixer.

23. A mobile communication system including an apparatus according to claim 1.

24. A mobile telephone handset including an apparatus according to claim 1.

25. An integrated circuit including an apparatus according to claim 1.

26. A method, comprising:
generating a first signal and a reference signal at a digital accumulator under the control of a accumulator reference clock signal;

digital to analogue converting the first signal under control of a further clock signal;

receiving at a first input of a phase frequency detector, the reference signal;

generating at the phase frequency detector a control signal;

summing the control signal with the converted first signal;

receiving the summed control signal and generating a signal defining an output frequency; and generating the further clock signal by dividing the accumulator reference clock signal.

27. An apparatus, comprising:

a phase frequency detector means for receiving at a first input means a reference signal and for generating a control signal at an output means;

a voltage controlled oscillator means comprising an input means for receiving a signal based on the control signal and for generating at an output means a signal defining an output frequency, a feedback path connecting the output means of the voltage controlled oscillator means to a second input means of the phase frequency detector means;

a digital accumulator means for generating the reference signal at a first output means under the control of an accumulator reference clock signal;

summing means having a first input means connected to the output means of the phase frequency detector means and an output means connected to the input means of the voltage controlled oscillator means;

a digital to analogue converter means having a first input means connected to a second output means of the digital accumulator, a second input means of the summing means being connected to an output means of the digital to analogue converter means, wherein the digital to analogue converter means is clocked by a clock signal derived from dividing the accumulator reference clock.

28. An apparatus according to claim 4, wherein the latch is clocked by a divided version of the accumulator reference clock signal.

29. An apparatus comprising:

a first phase frequency detector comprising first and second inputs and an output, the phase frequency detector configured to receive at the first input a reference signal and to generate a control signal at the output;

a first voltage controlled oscillator configured to receive a signal based on the control signal and to generate at an output a signal defining an output frequency;

a first feedback path configured to connect the output of the voltage controlled oscillator to the second input of the first phase frequency detector, wherein the feedback path comprises a mixer; and a digital accumulator configured to generate a signal under the control of an accumulator reference clock signal generated by a phase locked loop, the reference signal being based on the signal generated by the digital accumulator wherein the phase locked loop comprises a reference divider configured to receive a reference clock signal;

a second phase frequency detector comprising first and second inputs and an output, the second phase frequency detector configured to receive at the first input an output of the reference divider; and a second voltage controlled oscillator comprising an input connected to the output of the second phase frequency detector, wherein an output of the second voltage controlled oscillator is connected to an input to the mixer and provides the accumulator reference clock signal; and a second feedback path configured to connect the output of the second voltage controlled oscillator to the second input of the second phase frequency detector.

30. An apparatus according to claim 29, wherein the second feedback path comprises a divider.

31. An apparatus according to claim 29, comprising a low pass filter connected between the output of the second phase frequency detector and the input to the second voltage controlled oscillator.

32. An apparatus according to claim 29 in which the digital accumulator receives as an input a digital frequency input word.

33. An apparatus according to claim 29 wherein the control signal is provided to the first voltage controlled oscillator via a low pass filter.

* * * * *